US007223975B2

(12) United States Patent
Nara et al.

(10) Patent No.: US 7,223,975 B2
(45) Date of Patent: May 29, 2007

(54) INSPECTION APPARATUS FOR CIRCUIT PATTERN

(75) Inventors: Yasuhiko Nara, Hitachinaka (JP); Masaaki Nojiri, Hitachinaka (JP); Kouichi Hayakawa, Hitachinaka (JP); Hiroyuki Shinada, Mitaka (JP); Yukio Hagita, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 128 days.

(21) Appl. No.: 10/843,642

(22) Filed: May 12, 2004

(65) Prior Publication Data

US 2004/0227079 A1 Nov. 18, 2004

(30) Foreign Application Priority Data

May 14, 2003 (JP) .............................. 2003-135261

(51) Int. Cl.
H01J 37/28 (2006.01)
(52) U.S. Cl. .................................... 250/310
(58) Field of Classification Search ................. 250/310
See application file for complete search history.

(56) References Cited

U.S. PATENT DOCUMENTS 5,502,306 A 3/1996 Meisburger et al.
6,421,122 B2 7/2002 Nara et al.
6,493,082 B2 12/2002 Nara et al.
6,627,884 B2 * 9/2003 McCord et al. ............. 250/306

FOREIGN PATENT DOCUMENTS

JP 5-258703 10/1993
JP 2000-193594 A 7/2004

* cited by examiner

Primary Examiner—Nikita Wells
(74) Attorney, Agent, or Firm—McDermott Will & Emery LLP

(57) ABSTRACT

In a circuit pattern inspection apparatus, while an electron beam is irradiated onto a surface of a substrate having a plurality of chips where circuit patterns have been formed, a signal produced from the irradiated substrate is detected so as to form an image, and then, the formed image is compared with another image in order to detect a defect on the circuit patterns. Before the electron beam is irradiated onto either the chip or the plurality of chips so as to acquire the image for an inspection purpose, an electron beam is previously irradiated onto the region to be irradiated, so that charging conditions of the substrate to be inspected are arbitrarily controlled.

6 Claims, 6 Drawing Sheets

INSPECTION APPARATUS FOR CIRCUIT PATTERN

BACKGROUND OF THE INVENTION

The present invention is related to an inspection apparatus for inspecting circuit patterns of semiconductor devices formed on semiconductor wafers, circuit patterns of photomasks formed thereon, and the like.

As methods for inspecting defects which are present in circuit patterns formed on substrates, or boards to be inspected, e.g., semiconductor wafers and photomasks, inspection apparatus using electron beams and capable of accepting very fine processing of circuit patterns are known in this field in addition to inspection apparatus using optical images.

This inspection apparatus is designed in such a manner that SEM (Scanning Electron Microscope) is applied thereto, by which an image is produced from secondary electrons and reflected electrons, which are generated by irradiating an electron beam onto a substrate to be inspected. This inspection apparatus compares SEM images as to the same circuit pattern with each other so as to extract different pixels from the SEM image, and thus, recognizes these different pixels as defects.

In this inspection apparatus, image qualities of acquired SEM images are different from each other, depending upon a total number of irradiating operations of the electron beams with respect to the substrate to be inspected. When a total number of the electron beam irradiating operations is small, since an information amount as to an acquired inspection region is small, such a technique is known from, for example, JP-A-5-258703. That is, the same inspection region is irradiated plural times in order to acquire a sufficiently large number of images for an inspection purpose.

Otherwise, when a total number of the electron beam irradiating operations is large, since irradiation energy is high, there is such a problem that image contrast is changed due to a charging effect of the substrate to be inspected. As a result, another technique capable of acquiring an image by irradiating an electron beam one time is known from, for example, JP-A-2000-193594.

In this inspection apparatus, in such a case that an image is acquired by irradiating the electron beam one time, the following problems may occur due to a property of a substrate to be inspected. That is, contrast of the acquired image is fluctuated, and also, sufficiently higher contrast as to a subject portion cannot be obtained, since the electron beam is irradiated one time. To solve the above-explained problems, one solving method is performed in such a manner that since the same region of the image is irradiated by the electron beams plural times, an irradiation energy amount of the electron beams is increased. In this case, it is so assumed that a single transport of the substrate to be inspected which is transported along one direction while being scanned by an electron beam is referred to as a "line." Thus, in the case of a single irradiating operation, after a scanning operation of 1 line is accomplished, the substrate to be inspected is transported by 1 line along a direction perpendicular to the line, and then, an adjoining line is irradiated by an electron beam, whereas in the case of a plural irradiating operation, 1 line is irradiated plural times without transporting the substrate to be inspected along the perpendicular direction.

However, if the irradiation energy amount is increased in such a method, then there is such a risk. That is, a potential is locally and temporarily changed, so that a semiconductor wafer corresponding to the substrate to be inspected is destroyed. Also, since the same line is irradiated plural times, inspection time is delayed.

SUMMARY OF THE INVENTION

An object of the present invention is to provide such an inspection apparatus for inspecting a circuit pattern, while the circuit pattern inspection apparatus is capable of arbitrarily controlling a charging condition of a substrate to be inspected, and employs an electron beam having high reliability.

To achieve the above-described object, a circuit pattern inspection apparatus, according to an embodiment of the present invention, is featured by comprising a condition setting means for setting an inspection condition in such a manner that before an electron beam is irradiated onto either a chip or a plurality of chips so as to acquire an image for an inspection purpose, an electron beam is previously irradiated onto the region to be irradiated. Since this arrangement is employed, this circuit pattern inspection apparatus is equipped with such a function. That is, in the case that an inspecting operation of a wafer is carried out, before an image of this wafer for an inspection purpose is acquired, since an electron beam is irradiated onto the same portion, a charging condition of the wafer is changed, and thus, both brightness and contrast of an inspection image are changed.

Also, a circuit pattern inspection apparatus, according to another embodiment of the present invention, is featured by that a condition setting means for setting an inspection condition in such a manner that after an electron beam is irradiated onto either a chip or a plurality of chips so as to acquire an image for an inspection purpose, an electron beam is again irradiated onto the region to be irradiated. Since this arrangement is employed, this circuit pattern inspection apparatus is equipped with such a function. That is, a charging condition of a wafer is changed in order that electric charges are not stored, or the charging operation is accelerated.

Other objects, features and advantages of the invention will become apparent from the following description of the embodiments of the invention taken in conjunction with the accompanying drawings.

DETAILED DESCRIPTION OF THE INVENTION

Referring now to drawings, an inspection apparatus for inspecting a circuit pattern, according to an embodiment of the present invention, will be described in detail. In this embodiment, defects occurred in manufacturing steps of circuit patterns formed on semiconductor wafers are extracted. The inspection apparatus is used to extract defects as to a resist pattern, a CONT-system opening pattern, a fine pattern after etching process (diffusion system), a fine pattern after etching process (wiring system), and the like.

Figure 1:
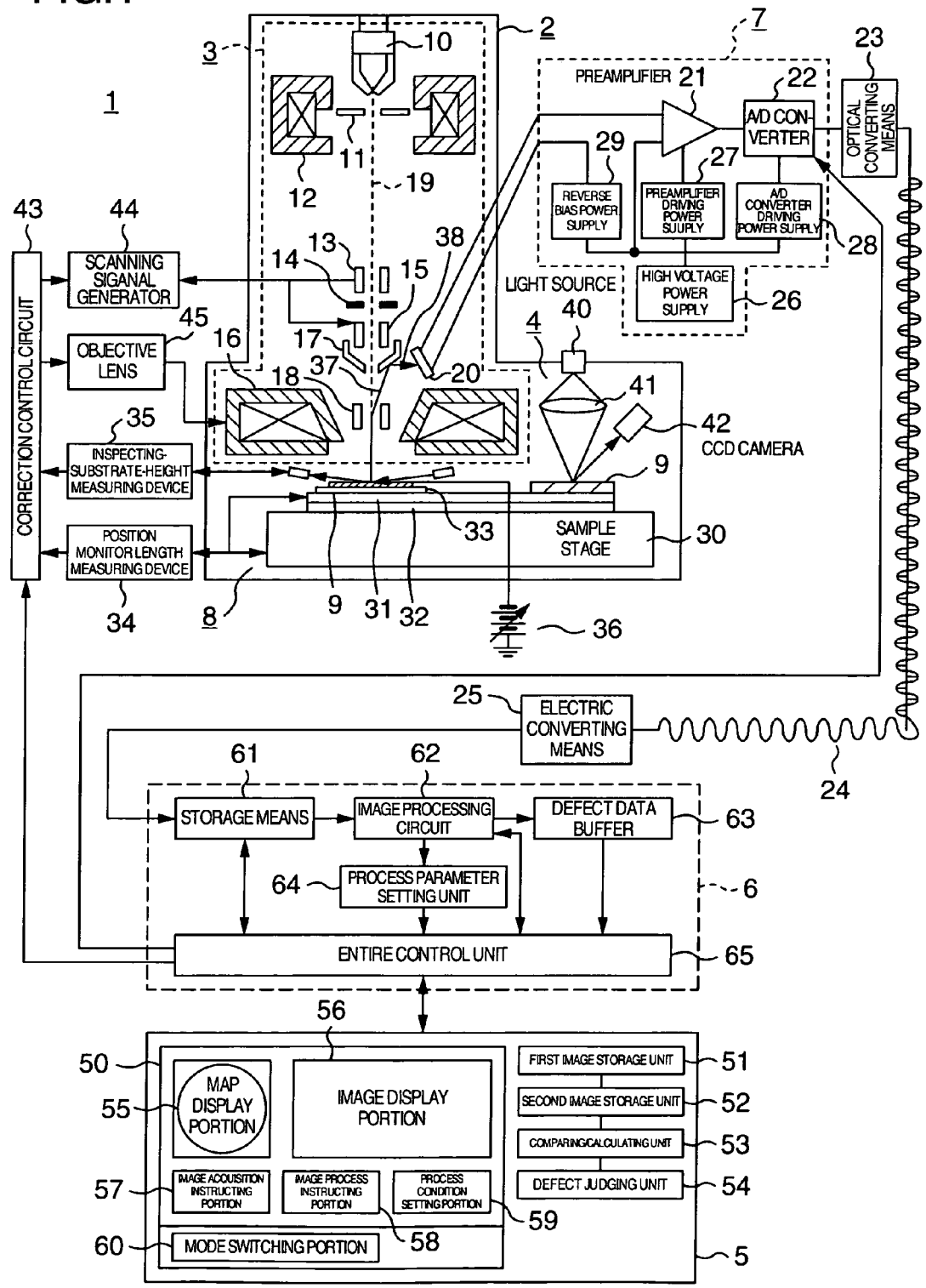
FIG. 1 is a longitudinal sectional view for showing a schematic arrangement of an inspection apparatus for inspecting a circuit pattern, according to an embodiment of the present invention.

FIG. 1 is a longitudinal sectional view for showing a schematic arrangement of an inspection apparatus 1 for inspecting a circuit pattern, according to an embodiment of the present invention. To the circuit pattern inspection apparatus 1, a secondary electron detecting unit 7, a control computer 6, and an image operation unit 5 are connected. The secondary electron detecting unit 7 converts a secondary electron detecting signal (will be discussed later) into an electric signal. The control computer 6 stores an electric image signal detected from the secondary electron detecting unit 7 so as to reduce noise and increase/decrease a signal, and also, transfers an instruction signal to a correction control circuit 43. The image operation unit 5 is equipped with a monitor which displays thereon either a result of defect extracting operation or an image thereof on a screen, and equipped with an input tool for an instruction of an operator.

The circuit pattern inspection apparatus 1 is provided with an inspection chamber 2 and an auxiliary chamber (not shown in this embodiment). In the inspection chamber 2, an interior portion of this chamber 2 is vacuum-exhausted. The auxiliary chamber is used to transport a substrate 9 to be inspected such as a semiconductor wafer to the inspection chamber 2. It should be noted that this auxiliary chamber is constructed in such a manner that the auxiliary chamber can be vacuum-exhausted in an independent manner from the inspection chamber 2.

The inspection chamber 2 is mainly constituted by an electro-optical system 3, a sample chamber 8, and an optical microscope unit 4. The electro-optical system 3 is arranged by an electron gun 10, an extracting electrode 11, a condenser lens 12, a blanking deflecting device 13, a scanning deflecting device 15, a diaphragm 14, an objective lens 16, a reflection plate 17, and an ExB deflecting device 18. In this electro-optical system 3, an electron beam 19 generated by the electron gun 10 is converged by the condenser lens 12 and the objective lens 16, and then, the converged electron beam 19 is irradiated onto the substrate 9 to be inspected.

An orbit of secondary electrons 37 which are produced from the substrate 9 to be inspected by irradiating the electron beam 19 onto this substrate 9 is deflected by the ExB deflecting device 18, and the secondary electrons 37 impinge on the reflection plate 17, so that second secondary electrons 38 are generated therefrom. The second secondary electrons 38 are detected by a secondary electron detector 20, the detection signal of this secondary electron detector 20 is supplied to the secondary electron detecting unit 7, and the signal derived from the secondary electron detecting unit 7 is amplified by a preamplifier 21 of this secondary electron detecting unit 7. Then, the signal amplified by the preamplifier 21 is A/D-converted into digital data by an A/D converter 22, the digital data is fed to an optical converting means 23 so as to be converted into an optical signal, and this optical signal is transferred by an optical transferring means 24. Then, this optical signal is again converted into an electric signal, and thereafter, this electric signal is supplied to the control computer 6.

The secondary electron detecting unit 7 is provided with a preamplifier 21, an A/D converter 22, an optical converting means 23, an optical transferring means 24, an electric converting means 25, a high voltage power supply 26, a preamplifier driving power supply 27, an A/D-converter driving power supply 28, and a reverse biasing power supply 29. Since this secondary electron detecting unit 7 is brought into a floating condition at a positive potential by the high voltage power supply 26, the second secondary electrons 38 which have impinged onto the reflection plate 17 to be generated are conducted to the secondary electron detector 20 by an absorbing electric field which is produced.

The sample chamber 8 is constructed of a sample stage 30, an X stage 31, a Y stage 32, a rotary stage 33, a position monitor length measuring machine 34, and a measuring machine 35 for measuring a height of a substrate to be inspected.

The optical microscope unit 4 has a light source 40, an optical lens 41, and a CCD (charge-coupled device) camera 42. This optical microscope unit 4 is located in the vicinity of the electro-optical system 3 employed inside the inspection chamber 2 and is installed at such a position that this optical microscope unit 4 is separated from the electro-optical system 3 while there is no mutual influence between them. The distance between the electro-optical system 3 and the optical microscope unit 4 is known in this field.

Either the X stage 31 or the Y stage 32 may be moved in a reciprocation manner over the predetermined distance between the electronic optical system 3 and the optical microscope unit 4. Also, either the rotary stage 33 or the sample stage 30 may be alternatively arranged in such a manner that an arbitrary side of this stage 33 or 30 is inclined so that an angle at which the electron beam 19 is irradiated onto the substrate 9 to be inspected may be varied.

The control computer 6 is arranged by an entire control unit 65 and the below-mentioned apparatus. That is, this control computer 6 contains a storage means 61, an image processing circuit 62, a process parameter setting unit 48, and also, a defect data buffer 63. The storage means 61 stores thereinto a digital signal derived from the secondary electron detecting unit 20. The image processing unit 62 processes the stored digital signal. The process parameter setting unit 48 sets a process parameter of the image processing circuit 62. The defect data buffer 63 buffers thereinto information as to a defect extracted by the defect judging unit 54 of the image operation unit 5.

On a screen 50 of the image operation unit 5, positions as to a plurality of defects held in the defect data buffer 63 can be displayed in a wafer map by way of dots, and/or an image of a defect stored in the storage means 61 can be displayed.

The image operation unit 5 contains a fist image storage unit 51, a second image storage unit 52, a comparing/calculating unit 53, and a defect judging unit 54. Such an image as an electron beam image and a defect image is displayed on an image display portion 56 of the screen 50 such as a monitor. Also, the screen 50 is provided with a map display portion 55, an image acquisition instructing potion 57, an image process instructing portion 58, and a process condition setting portion 59. The map display portion 55 displays thereon a plan view of the substrate 9 to be inspected so as to set an inspection region, and displays thereon a distribution of extracted defects. Furthermore, this screen 50 contains a mode switching portion 60 for designating an inspection mode, a defect confirmation mode, a recipe formation mode, a utility mode, and the like in accordance with an content of an operation.

The map display portion 55 is clicked by using a mouse (not shown), or the like so as to move the X stage 31 and the Y stage 32, and thus a place for setting a condition is selected. Also, since the image acquisition instructing unit 57 is clicked, the electron beam 19 is irradiated onto the substrate 9 to be inspected, so that an image of an inspection region is acquired. The process condition setting portion 59 can set such a process condition that a signal of an image is increased and/or decreased. When the image process instructing portion 58 is clicked, this set process condition is executed.

Operation commands and operation conditions as to various units of the circuit pattern inspection apparatus 1 are inputted/outputted from the image operation unit 5. Various conditions have been previously entered to the image operation unit 5 in such a manner that these conditions may be set in response to a purpose, while these various conditions correspond to an acceleration voltage when the electron beam 19 is generated, a deflection width of the electron beam 19, a deflection speed of the electron beam 19, signal acquisition timing of the secondary electron detecting unit 7, a move speed of the sample stage 30, and the like.

In response to the above-described signal supplied from the image operation unit 5, the control computer 6 sends a control signal to a correction control circuit 43. The correction control circuit 43 monitors a shift of a position and a shift of a height based upon a signal derived from the position monitor length measuring device 34 and another signal derived from the inspecting-substrate-height length measuring device 35. As a result of this monitoring operation, the correction control circuit 43 produces a correction signal, and then transfers the correction signal to the objective lens power supply 45 and a scanning signal generator 44 in such a manner that the electron beam 19 may be continuously irradiated onto a correct position.

In order to acquire an image of the substrate 9 to be inspected, such an electron beam 19 which has been focused in a narrow mode is irradiated onto the substrate 9 to be inspected so as to generate secondary beams 37, and these secondary beams 37 are detected in synchronism with both the scanning operation of the electron beam 19, and the movement of the X stage 31 and of the Y stage 32, so that an image of a surface of the substrate 9 to be inspected is acquired.

When a semiconductor wafer is inspected, it is desirable that an inspection speed becomes high. As a consequence, in the circuit pattern inspection apparatus 1 of this embodiment, such an operation is not carried out. That is, as executed in the normal SEM, an electron beam of an electron beam current on the order of "pA" is scanned in a low speed, a scanning operation is carried out many times, and the respective images are overlapped with each other. Also, in order to suppress charging operation to an insulating material, an electron beam must be scanned in a high speed one time, or several times.

In this embodiment, the circuit pattern inspection apparatus 1 has been constituted in such a manner that since a large current electron beam of, for instance, 100 nA is scanned only one time, which is approximately 100 times larger than that of the normal SEM, an image is formed. A scanning width is selected to be 100 $\mu m^2$, one pixel is selected to be 0.1 $\mu m^2$, and a single scanning operation is carried out within a time period of 1 $\mu s$.

As the electron gun 10, a diffusion supply type thermal field emission electron source is used. Since this electron gun 10 is employed, a stable electron beam current can be secured, and thus, an SEM image having a small bright variation can be obtained, as compared with the conventional tungsten electron source, and a cold electric field emission mode electron source. Also, since the electron beam current can be set to a large electron beam current by this electron gun 10, a high-speed inspection can be realized.

Since a voltage is applied between the electron gun 10 and the extracting electrode 11, the electron beam 19 is extracted from the electron gun 10. Also, since a negative high potential is applied to the electron gun 10, the electron beam 19 is accelerated. The electron beams 19 are propagated along a direction of the sample stage 30 with having such an energy equivalent to this applied potential, the propagated electron beams 19 are converged by the condenser lens 12, and further, the converged electron beams 19 are focused to be narrowed by the objective lens 16, and then, the focused electron beam 19 is irradiated onto the substrate 9 to be inspected which is mounted on the X stage 31 and the Y stage 32 on the sample stage 30. It should be noted that the substrate 9 to be inspected corresponds to a semiconductor wafer, a semiconductor chip, or liquid crystal, and a substrate having a very fine circuit pattern such as a mask.

It should also be noted that the scanning signal generator 44 is connected to the blanking deflecting device 13, by which both a scanning signal and a blanking signal are generated, whereas the objective lens power supply 45 is connected to the objective lens 16.

A negative voltage is applied to the substrate 9 to be inspected by a retarding power supply 36. Since the negative voltage of this retarding power supply 36 is adjusted, the electron beam 19 can be decelerated, and electron beam irradiation energy with respect to the substrate 9 to be inspected can be controlled to be an optimum energy value while the potential of the electron gun 10 is not changed. The secondary electron 37 generated by irradiating the electron beam 19 onto the substrate 9 to be inspected is accelerated by the negative voltage applied to the substrate 9 to be inspected.

The ExB deflecting device 18 is arranged above the substrate 9 to be inspected, so that the secondary electron 37 is deflected along a predetermined direction. An amount of this deflecting operation can be adjusted based upon both a voltage and a strength of a magnetic field, which are applied to the ExB deflecting device 18. Also, this electromagnetic field can be varied in an interlocking manner with the negative voltage applied to the substrate 9 to be inspected. The secondary electron 37 deflected by the ExB deflecting device 18 impinges on the reflection plate 17. This reflection plate 17 has a circular cone shape, and is manufactured with a pipe structure in an integral form in order to have a shielding function of a deflecting device for the electron beam which is irradiated onto the substrate 9 to be inspected. When the accelerated secondary electron 37 impinges on this reflection plate 17, the second secondary electrons 38 having energy of several eV to 50 eV are produced from the reflection plate 17.

The secondary electron detector 20 is constructed as follows: The second secondary electron 38 generated in such a manner that the secondary electron 37 generated while the electron beam 19 has been irradiated onto the substrate 9 to be inspected is thereafter accelerated and then this accelerated secondary electron 37 impinges on the reflection plate 17 is detected in an interlocking manner with respect to the scanning timing of the electron beam 19.

An output signal of the secondary electron detector 20 is amplified by the preamplifier 21 of the secondary electron detecting unit 7 which is installed outside the inspection chamber 2, and then, the amplified signal is A/D-converted by the A/D converter 22 to become digital data. The A/D converter 22 is constituted in such a manner that just after the analog signal detected by the secondary electron detector 20 is amplified by the preamplifier 21, the A/D converter 22 converts the amplified analog signal into the digital signal, and then, this digital signal is transmitted to the control computer 6. Since the detected analog signal is digitized just after the detection and then this digitized signal is transmitted, such a signal having a high S/N ratio can be acquired in a high speed.

While the substrate 9 to be inspected is mounted on the X stage 31 and the Y stage 32, when an inspecting operation is carried out, both the X stage 31 and the Y stage 32 are set to a stationary condition, and the electron beam 19 is scanned in a two-dimensional manner. Otherwise, while the Y stage 32 is continuously moved at a constant speed along the Y direction, the electron beam 19 is scanned in a linear manner along the X direction. In such a case that a relatively small specified region is inspected, a method for inspecting this small region by setting the former stage to a stationary manner may be effectively employed, whereas in the case that a relatively wide region is inspected, such a method for inspecting this wide region by continuously moving the stages at a constant speed may be effectively employed. When the electron beam 19 is required to be blanked, the electron beam 19 is deflected by the blanking deflecting device 13, and the electron beam 19 does not pass through the diaphragm 14, so that the electron beam 19 can be controlled in such a way that the substrate 9 to be inspected is not irradiated by the electron beam 19.

In this embodiment, as the position monitor length measuring device 34, such a length measuring device operated by way of laser interference has been employed. As a result, both a position of the X stage 31 and a position of the Y stage 32 can be monitored in real time, and the positional information is supplied to the correction control circuit 43. Also, data as to rotation numbers of the respective motors for the X stage 31, the Y stage 32, and the rotary stage 33 are similarly supplied from the respective drivers to the correction control circuit 43. The correction control circuit 43 can grasp a region and a position, on which the electron beam 19 is irradiated, based upon the above-described data. Also, a positional shift (positional deviation) of an irradiating position of the electron beam 19 is corrected in real time by the correction control circuit 43, if required. Also, such a region where the electron beam 19 has been irradiated may be stored every the substrate 9 to be inspected.

The measuring device 35 for measuring the height of the substrate to be inspected is arranged as follows: That is, while an optical type measuring device corresponding to a measuring system other than an electron beam is employed, for instance, while either a laser interference measuring device or a reflection light type measuring device for measuring a change at a position of reflection light is employed, a change in heights of the substrate 9 to be inspected which is mounted on the X stage 31 and the Y state 32 can be measured in real time. In this embodiment, such a measuring system has been employed. In this measuring system, narrow white light which has passed through a slit is irradiated through a transparent window onto the substrate 9 to be inspected, a position of reflection light is detected by a position detecting monitor, and thus, a change amount of heights is calculated from a variation of the positions.

The focal distance of the objective lens 16 used to focus the electron beam 19 in the narrow beam manner is dynamically corrected based upon the measurement data of this inspecting-substrate-height measuring device 35, so that such an electron beam 19 which has been always focused onto an inspection region can be irradiated. Alternatively, while a camber and a height distortion of the substrate 9 to be inspected may be previously measured before an electron beam is irradiated thereonto, a correction condition of the objective lens 16 every inspective region may be set based upon this measured data.

Next, a description is made of an arrangement of the image operation unit 5. An image signal of an inspection region of the substrate 9 to be inspected, which is detected by the secondary electron detector 20, is amplified by the preamplifier 21. After the amplified image signal is digitized by the A/D converter 23, this digital image data is converted into an optical image signal by the optical converting means 23, and then, this optical image signal is transferred by the optical transferring means 24 such as an optical fiber cable. The transferred image signal is again converted into an electric image signal by the electric converting means 25, and thereafter, this electric image signal is supplied to the control computer 6. Then, this electric image signal is stored into either the first image storage unit 51 or the second image storage unit 52 of the image operation unit 5 from the entire control unit 65 of the control computer 6.

The comparing/calculating unit 53 of the image operation unit 5 compares/calculates this stored image signal with another image signal stored in another image storage unit. The defect judging unit 54 compares an absolute value of a difference image signal with a predetermined threshold value. This difference image signal corresponds to a result made by the comparing/calculating operation of the comparing/calculating unit 53. In such a case that the signal level of the difference image is larger than the predetermined threshold value, the defect judging unit 54 judges this pixel as a defect candidate, and displays this judged pixel on the image display portion 56. This position is displayed on the map display portion 55, and in the case that a plurality of defects are extracted, a total number thereof, or the like are displayed on this map display portion 55.

Figure 2:
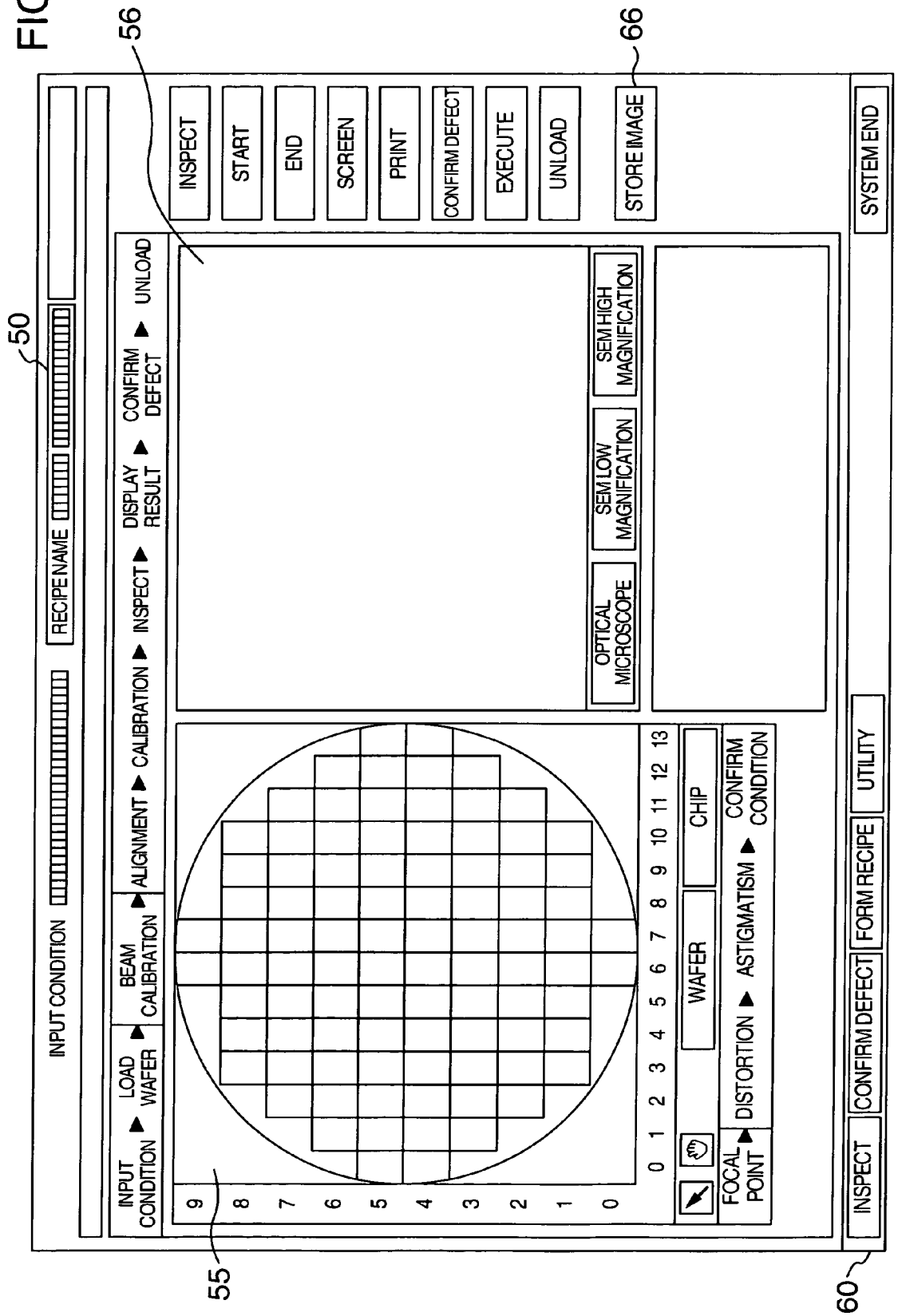
FIG. 2 is a screen diagram for representing a display example of an image operation unit of the circuit pattern inspection apparatus shown in FIG. 1.

Next, a condition when an inspecting operation is carried out, namely, setting of a recipe during an inspecting operation will now be explained. FIG. 2 is a screen diagram for indicating a display example of the image operation unit 5, namely represents an example in an initial stage of an inspecting operation. The map display portion 55, the image display portion 56, and buttons for various sorts of instructions are displayed on the screen 50. The map display portion 55 displays thereon a present position of a stage. The image display portion 56 displays thereon an optical microscopic image which is acquired by the optical microscope unit 5 shown in FIG. 1, and an SEM image which is acquired by the secondary electron detector 20. In the initial stage of the inspecting operation within the example of FIG. 2, the optical microscopic image is displayed on the image display portion 56. The mode switching portion 6 is located below the screen 50, and a plurality of buttons are being displayed on this mode switching portion 6. For example, since a mouse pointer, or the like is fitted to an inspection button and this inspection button is clicked, the circuit pattern inspection apparatus 1 is set to an automatic inspection executing mode. When a recipe is formed, since a button for forming a recipe is clicked, the present mode screen is changed into a recipe forming screen (will be explained later). In the screen region where both the map display portion 55 and the image display portion 56 are being displayed, contents to be displayed are changed by switching the modes.

Operation buttons which are commonly used on a plurality of screens are displayed on the right side of the image display portion 56, for instance, "inspect"; "start"; "end"; "screen"; "print"; "confirm defect"; "execute"; "unload"; "image store", and the like are displayed. For example, when an image store button 66 is clicked, such a screen is displayed which designates a name used to store an image which is presently displayed as an image file.

As to various sorts of parameters which are required so as to execute an inspecting operation, there are parameters specific to substrates to be inspected, and other parameters for determining operation conditions of the inspection apparatus 1.

The parameters specific to the substrate to be checked are mainly subdivided into two sorts of parameters. One of these specific parameters is referred to as a "product sort parameter", and this product sort parameter corresponds to such a parameter having no relationship with a layer which is formed in a half way of a manufacturing process. This product sort parameter corresponds to, for example, a wafer size; either an orientation flat or a shape of a notch; an exposing shot size of a semiconductor product; a chip (or die) size; a memory cell region; a size of a repetition unit of a memory cell; an inspection region, and the like. These items have been formed as a table of "product sort file", and have been stored in a memory, or the like.

Another parameter of the specific parameters is such a parameter called as a "step file." This "step file" parameter corresponds to such a parameter which is required to be adjusted, since materials of surfaces and states of shapes are different due to layers in a half way of a manufacturing process. For example, this "step file" parameter corresponds to an irradiation condition of an electron beam; various sorts of gains for a detection system; a condition of image process operation used to detect a defect. These parameters have been registered as "step file."

When an inspecting operation is carried out, since either a name or a number is designated to which both this "product sort file" and the "step file" have been registered, such an inspection condition can be called which corresponds to a specific semiconductor product and a specific manufacturing step. In this embodiment, both "product sort file" and "step file" are grouped to be referred to as a "recipe." Also, a series of operations for inputting these various sorts of parameters and/or for registering these various sorts of parameters will be referred to as "recipe forming."

Figure 3:
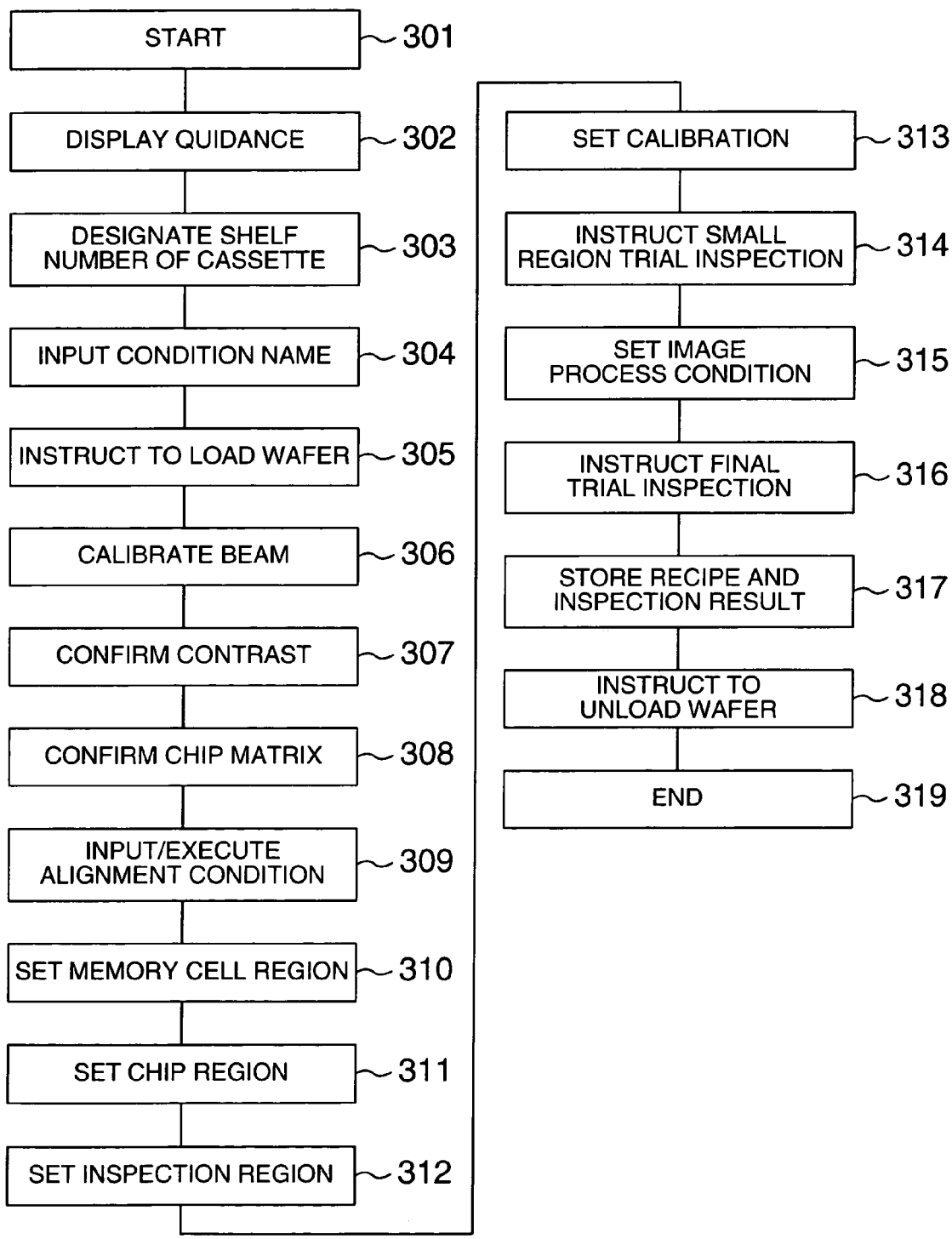
FIG. 3 is a flow chart for describing sequential process operations of a recipe forming mode executed in the circuit pattern inspection apparatus.
Figure 4:
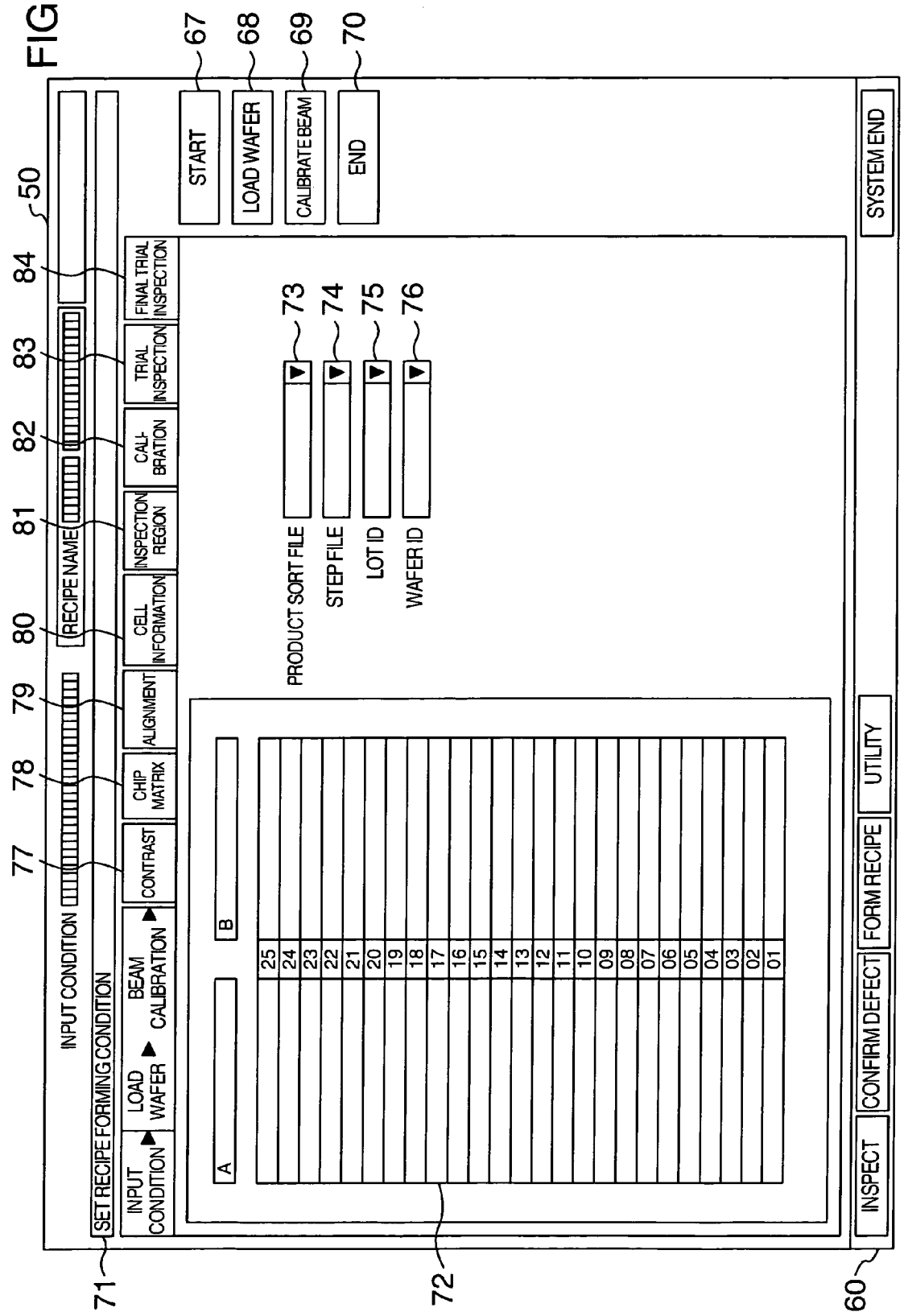
FIG. 4 is a screen diagram for indicating a display example when the recipe is formed.

FIG. 3 is a flow chart for indicating sequential process operations of a recipe forming mode. Also, FIG. 4 is a screen diagram for indicating a display example when a recipe is formed. A recipe forming button of the mode switching operation 60 located below the screen 50 is displayed in a different color from colors of other buttons, which indicates that the recipe forming mode is presently set. When a start button 67 located at a right portion of the screen 50 is pushed (step 301), for example, "set recipe forming condition" is displayed on a guidance display portion 71 located above the recipe forming mode screen 50 (step 302), and a shelf number is designated on a cassette shelf number display portion 72 which is displayed in a left side of this screen 50. The designated shelf number is displayed in a color discriminatable manner. A pull-down menu of a product sort file setting portion 73 and a step file setting portion 74, which are displayed on the screen 50, are caused to be represented so as to call a recipe file. Both a product sort file condition and a step file condition are designated, or entered in response to a selecting operation, a newly setting operation, or a changing operation. Further, a lot ID of the relevant wafer and a wafer ID thereof are entered by using a lot ID setting portion 75 and a wafer ID setting portion 76 (step 304).

In this example, a changing operation of a recipe file implies such an operation that a recipe forming condition is changed irrespective of such a fact that a wafer is loaded. However, under normal condition, a recipe file is changed while a wafer is loaded.

Also, in the case that another recipe of another apparatus (will be explained later) is used, since this recipe cannot be directly entered in this inspection apparatus 1, the below-mentioned work is carried out. That is, defect information file (content of this file has been opened to user) as to an inspection result is entered, this entered defect information file is converted so as to form a recipe usable in the own inspection apparatus, and then, this formed recipe is changed in this step in order to supplement this shortage data.

Next, a wafer load button 68 is clicked in order that a wafer corresponding to the substrate to be inspected is loaded from a wafer cassette which has been installed on a loader of the inspection apparatus 1 (step 305). The inspection apparatus 1 detects either an orientation flat or a notch of the wafer, and holds the wafer on a sample holder of a sample exchanging chamber, and then, transports the sample holder so as to mount this transported sample holder on a stage of an inspection chamber.

Next, a beam calibration button 69 is clicked in order to instruct a beam calibration. The inspection apparatus 1 moves the wafer to a stage reference mark, and executes an absolute calibration of an electron beam (step 306). This absolute calibration corresponds to such a calibration executed based upon the normal default recipe file condition (step 306). In this absolute calibration, the electron beam is irradiated; a deflection correction is executed; a reference coordinate correction is performed; and a focal point parameter correction is carried out.

Next, a contrast tab 77 located above the screen 50 is clicked so as to replace the screen display by a contrast menu (not shown), the electron beam is irradiated onto a position which is designated on the wafer, and the image of the wafer is displayed in order to confirm contrast of this image. Thereafter, a focal point and astigmatism are readjusted (step 307). In this case, alignment chips are pointed, and an origin of a first chip is set under the optical microscope by which the monitor displays an image, then an alignment mark position of the first chip is moved to a position under the optical microscope in a manual mode. Then, after the microscope image has been registered, an acquisition of an SEM image is instructed; the alignment mark position of the first chip is moved to a position under the SEM in a manual manner and in a very fine adjusting mode; the acquired SEM image is registered; and the alignment coordinate is registered.

Next, a chip matrix tab 78 is clicked so as to display this screen (not shown), and a chip which should be inspected is designated (step 308). In this step, both a size and an array of the chip are inputted, and either an inspection subject region of a wafer peripheral portion or a condition as to whether or not the chip is present is designated. Either the inspection subject chip or the respective subject chip, which has been set in this step, is stored in the step file in the new name.

Subsequently, an alignment tab 79 is clicked so as to display an alignment screen (not shown), so that both an alignment condition is inputted and the alignment is executed (step 309). In this step, an alignment chip is designated by way of a plurality of points; and is moved to an origin of a first alignment chip; the optical microscope is switched to the used monitor; and the alignment chip is moved to an alignment mark position of the first alignment chip in a manual mode. Then, after the microscopic image has been registered, an acquisition of an SEM image is instructed; the alignment chip is moved to the alignment mark position in a manual manner and in a very fine adjusting mode; the acquired SEM image is registered; and the alignment coordinate is registered.

As items for executing the alignment, the below-mentioned items are operated: That is, (1) moving operation of first point; (2) image inputting/searching/matching operations; (3) moving operation of second point; (4) image inputting/searching/matching operations; (5) moving/searching/matching to remaining points; and (6) inclination/position/chip interval correction are carried out.

Also, as items of offset setting operation of chip origin, the below-mentioned items are operated: That is, (1) moving operation to final point alignment; (2) designating operation of alignment mark point (SEM image); (3) moving operation to first chip origin; (4) designating operation of chip origin position (SEM image); and (5) offset calculating/registering operation of chip origin-to-alignment mark are carried out. In this case, an offset value of a chip origin implies such a distance between an alignment coordinate and an origin coordinate of a chip where this mark is present.

As previously explained, an offset value between a designated alignment-purpose pattern coordinate and a chip origin is inputted so as to be registered as an alignment parameter within the step file. While a recipe is formed, since there are many parameters which are used to designate coordinates on a wafer where various sorts of process operations are carried out, an alignment condition is firstly defined and registered, and is executed until an alignment.

Next, a cell information tab 80 is clicked so as to switch the alignment screen into a cell information screen (not shown), and then, a memory cell region within a chip is set (step 310). As items for setting the memory cell region, a cell region is inputted; a cell pitch is inputted; and both the cell region and the cell pitch are registered. The cell region is inputted by employing both an optical microscope image and an SEM image.

Next, a chip region setting operation is carried out on the same cell information screen (step 311). As items of chip region setting operations, a chip region is inputted; a chip non-inspection region is inputted; and both the chip region and the chip non-inspection region are registered. The chip region is inputted by employing both an optical microscope image and an SEM image.

Next, an inspection tap 81 is clicked so as to display an inspection region designating screen (not shown), and then, an inspection region is designated (step 312). When an inspection region is designated, two sorts of inspection regions can be designated, namely, an inspection subject chip and an inspection region within a chip can be designated. In the case that all of chips formed on a wafer need not be inspected, or in such a case that only a specific region within a chip is wanted to be inspected, the region which is wanted to be inspected may be arbitrarily designated. Alternatively, an inspection sampling ratio may be designated, namely, a ratio of the area which is wanted to be inspected to all of the chips may be designated. Since such a function is provided, only the region which is wanted to be inspected can be checked, so that inspection time can be shortened. Also, such a designation may be carried out as to whether a wafer is moved along the X direction, or the Y direction. The data as to the chip region and the inspection region are stored as the parameters within the step file.

When the designating operation of the inspection region is accomplished, a calibration tab 82 is clicked so as to display a calibration screen (not shown), and then, a calibration setting operation is carried out by which a brightness during inspecting operation is adjusted (step 313). A calibration operation implies such an operation that while an image is acquired, a gain control and a brightness correction of an apparatus are carried out in response to a signal amount based upon a brightness distribution. In an actual calibration operation, this calibrating operation is carried out by designating a chip where the calibrating operation is performed, and by designating a coordinate value within the chip. The coordinate value for executing the calibration, the gain of the brightness, and the offset value are stored as the parameters within the step file.

Next, an image is actually acquired under the various sorts of conditions which have been set in the previous steps, and then, an image processing condition for detecting a defect is set. First, a trial inspection tab 83 is clicked so as to display a setting screen of an image processing condition by way of trial inspection (not shown). When an SEM image is firstly acquired, a sort of filters used to filter a detection signal is selected. Then, an image of a small region within 1 chip is acquired under the same condition as that of the actual inspection. In this case, this small region implies, for instance, such a region having a length for a single chip and having a width of 100 μm equal to an operation width of an electron beam. After the image has been acquired, a threshold value for judging a defect is entered, and then, in such a case that there is a place which is judged as the defect, an image of this place is displayed (step 314). Since this trial inspection operation is repeatedly carried out, an optimum parameter is determined (step 315). The parameters such as the threshold value and the file, which have been set in this step, are stored as parameters within the step file.

With execution of the above-explained process operations, various sorts of parameters required in an inspection operation are set. However, with respect to actual semiconductor wafers, manufactured qualities as to all of semiconductor chips are not made uniform due to process fluctuations within wafer planes and among manufacturing lots. Thus, there are many possibilities that the image processing condition set only by the trial inspection as to the small region cannot establish a satisfactory image processing condition, so that a threshold value used to judge a defect must be determined by considering the process fluctuations.

As a consequence, in order that a final trial inspecting operation for a single sheet of wafer is carried out based upon the formed recipe file, a final trail inspection tab 84 is clicked to display an image (not shown) of the final trial inspecting operation (step 316). In the final trial inspecting operation, while the stage is continuously moved in a constant speed, an image acquiring operation is executed. While both a position and a height where an electron beam is being irradiated are monitored at the same time, a scanning operation of the electron beam is corrected in real time. Then, secondary electrons are detected, a detected signal is processed by performing the A/D converting operation, the image based on the detected signal is stored into the image memory, and the image processing operation, the image comparing operation, and the defect judging operation are executed. Also, a shift between the continuous move direction of the wafer and the deflection width of the electron beam is corrected. As to defect extracted results obtained in the final trial inspecting operation, positions of defects are displayed and a total number of these defects are displayed on the map display portion 55 shown in FIG. 2. Both a defect detecting level and an error detecting level are confirmed, and if the used recipe corresponds to a finally proper recipe, then both the inspection results and the various sorts of parameters which have been so far entered are registered in both the product sort file and the step file (step 317). Finally, an end button 70 is clicked, so that an unloading operation of this inspected wafer is carried out (step 318). Thus, the recipe forming step is accomplished (step 319).

Figure 5:
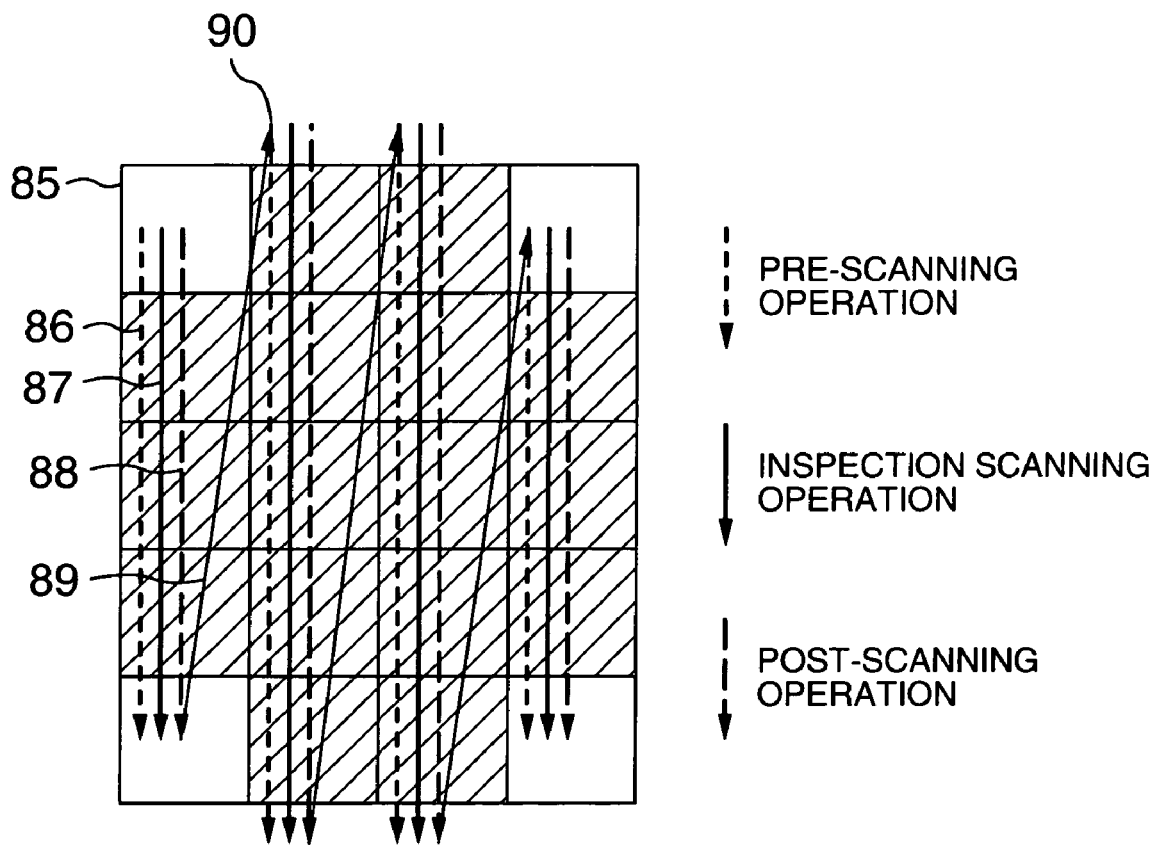
FIG. 5 is a plan view for indicating an array of chips on a substrate to be inspected.

FIG. 5 is a plan view for showing an array of chips on a substrate to be inspected. In an inspection apparatus of a circuit pattern using an electron beam, in such a case that an image is acquired by irradiating the electron beam one time, the following problems may occur due to a property of a substrate to be inspected. That is, contrast of the acquired image is fluctuated, and also, sufficiently higher contrast as to a subject portion cannot be obtained, since the electron beam is irradiated one time. To solve the above-explained problems, one solving method is performed in such a manner that since the same region of the image is irradiated by the electron beams plural times, an irradiation energy amount of the electron beams is increased. In this case, it is so assumed that a single transport of a substrate to be inspected which is transported along one direction while being scanned by an electron beam is referred to as a "line." Thus, in the case of a single irradiating operation, after a scanning operation of 1 line is accomplished, the substrate to be inspected is transported by 1 line along a direction perpendicular to the line, and then, an adjoining line is irradiated by an electron beam, whereas in the case of a plural irradiating operation, 1 line is irradiated plural times without transporting the substrate to be inspected along the perpendicular direction.

However, if the irradiation energy amount is increased in such a method, then there is such a risk. That is, a potential is locally and temporarily changed, so that a semiconductor wafer corresponding to the substrate to be inspected is destroyed. Also, since the same line is irradiated plural times, inspection time is delayed.

In this embodiment, as represented in FIG. 5, in such a case that an inspection subject chip indicated in a gray color among a plurality 85 is scanned by an election beam, a transport direction of the substrate to be inspected during the electron beam scanning operation is performed as illustrated by a transport direction 86 of a pre-scanning operation.

In other words, a pre-irradiating operation is carried out one time as to all of inspection subject chips among chips arrayed in a first column. In this pre-irradiating operation, while the electron beam is scanned, the substrate to be inspected is transported over a length of 1 line along the transport direction 86 of the pre-scanning operation; and subsequently, is transported only over a distance equal to the width of 1 line along the perpendicular direction. This process operation is repeatedly carried out. Next, as to all of the inspection subject chips among the chips arrayed in the first column, an electron beam is irradiated so as to acquire an inspection image one time in a similar manner to that of the pre-scanning operation, while the substrate to be inspected is transported along a direction indicated by a transport direction 87 of an inspection scanning operation. Subsequently, as to all of the inspection subject chips among the chips arrayed in the first column, a post-irradiating operation is carried out one time in a similar manner to that of the pre-scanning operation, while the substrate to be inspected is transported along a direction indicated by a transport direction 88 of a post-scanning operation. While a series of the above-described scanning operations is considered as one set, when one set scanning operation is accomplished, the electron beam is blanked as represented in an electron move direction 89 in order not to be irradiated onto the substrate to be inspected. Then, the position of the electron is moved to a starting point 90 of a pre-scanning operation for a pair of the next chip column. Then, a scanning operation of an electron beam is repeatedly carried out in a similar manner with respect to each of pairs every chip column.

As previously explained, while the same line is not irradiated plural times, either one chip or chips of one column are previously irradiated by the electron beam plural times. Then, since images which have been acquired when the chips for 1 column are irradiated are employed as the inspection images, temporal delays required for improving the charging condition may be produced, as compared with such a case that regions of 1 line are irradiated plural times, so that local increases of the potential can be prevented.

Also, when the irradiating operation for the chips of 1 column is repeatedly carried out, since such electronic optical conditions as an acceleration voltage and an irradiation current amount are varied, the charging conditions of the substrate to be inspected can be changed, and thus, more flexible inspecting operations can be realized. When the charging conditions of the substrate to be inspected can be varied, contrast of such an image that defects thereof are emphasized can be obtained, so that an efficiency of the inspecting operations can be improved.

Furthermore, when the irradiating operation for the chips of 1 column is repeatedly carried out, a charging condition can be set to a desirable charging condition by employing such a method. That is, a width of 1 line is changed, widths of the respective lines are overlapped with each other, and a width which is not scanned is provided between the respective lines. Also, as to 1 line, a transport direction during a pre-irradiating operation is made coincident with a transport direction when an irradiating operation for acquiring an inspection image is carried out, so that temporally uniform charges may be applied.

It should be understood that a post-irradiating operation may be alternatively omitted within 1 set. In this alternative case, such a phenomenon occurs. That is, electric charges are accumulated by the electric charges produced in 1 set and irradiating operation for the next set. When the electric charging effects are progressed, the electron beam is deflected by an electric field, and contrast of acquired images is changed every time a total number of irradiating operations is incremented, so that these images having the changed contrast may be detected as pseudo-defects.

As a consequence, since a post-irradiating operation is carried out after an irradiating operation for acquiring an inspection image has been carried out within 1 set, a charging condition are accelerated in an earlier stage so as to be brought into a saturated condition, or a charging condition is returned to an original condition, depending upon an irradiation subject, so that qualities of entire images of a substrate to be inspected may be made uniform, and thus, pseudo-defects are not extracted.

Figure 6:
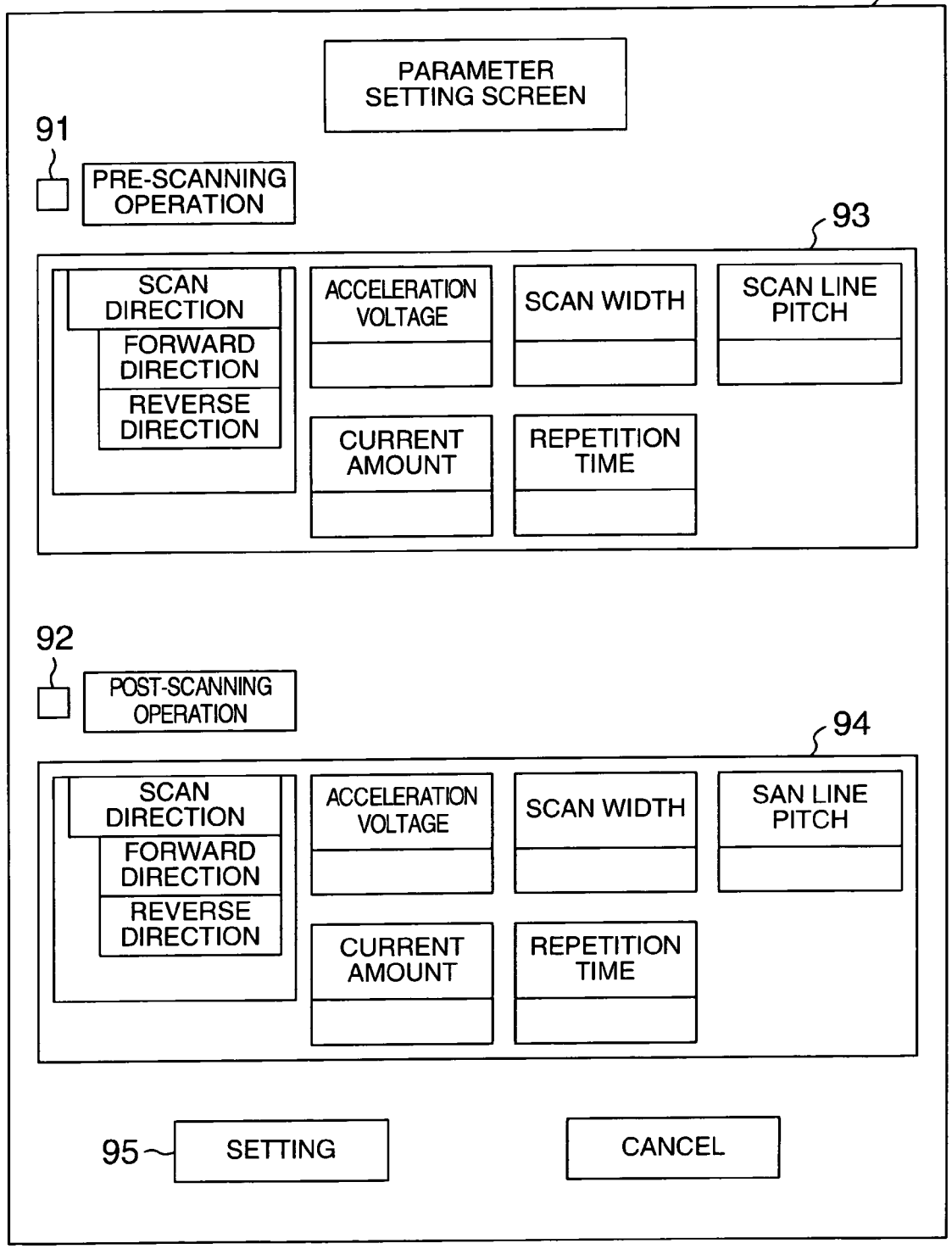
FIG. 6 is a screen diagram for setting parameters when the recipe is formed.

FIG. 6 is a screen diagram for setting a parameter when a recipe is formed, namely, corresponds to such an operation screen. That is, with respect to a pre-irradiating operation and a post-irradiating operation, an electro-optical condition such as an acceleration voltage and a current value is set; a scanning direction (namely, transport direction of substrate to be inspected) is set; and a repetition time, a scanning width, a scanning line pitch, and the like are set. When a setting/instruction inputting portion 91 of a pre-scanning operation implying a pre-irradiating operation is clicked so as to make a check mark, or a setting/instruction inputting portion 92 of a post-scanning operation implying a post-irradiating operation is clicked so as to make a check mark, such a value which has been previously set in either a parameter input portion 93 of the pre-scanning operation or a parameter input portion 94 of the post-scanning operation is displayed, and this displayed value can be changed. When the value is confirmed, since a setting button 95 is clicked, the relevant parameter is set.

As previously described, in accordance with this embodiment of the present invention, since the irradiating method of the electron beam is modified, the charging conditions of the substrate to be inspected can be arbitrarily controlled, and a total number of the above-described pseudo-defects contained in the defects which have been extracted based upon the acquired images can be reduced. Therefore, there is such an effect that reliability can be increased.

Also, since the chip inspection, the wafer extracting inspection, and the like can be quickly carried out while monitoring the screen, such a defects occurred in the entire product, or a defect occurred in a specific region can be quickly sensed. Also, the variation in the process conditions can be firmly sensed, and this condition variation is fed back to the process. At the same time, the process for manufacturing semiconductor device can be uniformized to reduce extra cost.

Furthermore, since the inspection apparatus according to the present invention is applied to a substrate product process, abnormal values of a product apparatus and/or a condition can be discovered in an earlier stage and in high precision with reference to the screen of the inspection apparatus. As a result, the abnormal condition solving treatment can be quickly realized in the substrate manufacturing process. As a result, failure rates as to semiconductor devices and other substrates can be reduced, and the productivity can be increased.

In accordance with the present invention, such a circuit pattern inspection apparatus capable of arbitrarily controlling the charging conditions of the substrate to be inspected can be provided, while employing the electron beam having high reliability.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An inspection apparatus for inspecting a circuit pattern, in which, while an electron beam is irradiated, in a set of pre-scan, image scan, and post-scan operations, onto a surface of a substrate having a plurality of chips where circuit patterns have been formed, a signal produced from the irradiated substrate is detected so as to form an image, and then, said formed image is compared with another image in order to detect a defect on the circuit patterns, comprising:

condition setting means for setting an inspection condition in such a manner that before said electron beam is irradiated onto either said chip or said plurality of chips so as to acquire said image for an inspection purpose, an electron beam is previously irradiated onto said region to be irradiated.

2. A circuit pattern inspection apparatus as claimed in claim 1 wherein:

an electro-optical condition as to the electron beam which is previously irradiated prior to the acquisition of said image for the inspection purpose is set in a discriminatable manner with respect to an electro-optical condition as to the electron beam which is irradiated so as to acquire said image for the inspection purpose.

3. A circuit pattern inspection apparatus as claimed in claim 2 wherein:

an electro-optical condition as to the electron beam which is previously irradiated prior to the acquisition of said image for the inspection purpose corresponds to a transport direction of a substrate to be inspected, an acceleration voltage, a current, a scanning width, a scanning line pitch, and a repetition time.

4. An inspection apparatus for inspecting a circuit pattern, in which while an electron irradiated, in a set of pre-scan, image scan, and post scan operations, onto a surface of a substrate having a plurality of chips where circuit patterns have been formed, a signal produced from the irradiated substrate is detected so as to form an image, and then, said formed image is compared with another image in order to detect a defect on the circuit patterns, comprising:

condition selling means for selling an inspection condition in such a manner that after said electron beam has been irradiated onto either said chip or said plurality of chips so as to acquire said image for an inspection purpose, the electron beam is again irradiated onto said region to be irradiated.

5. A circuit pattern inspection apparatus as claimed in claim 4 wherein:

an electro-optical condition as to the electron beam which is again irradiated after the acquisition of said image for the inspection purpose is set in a discriminatable manner with respect to an electro-optical condition as to the electron beam which is irradiated so as to acquire said image for the inspection purpose.

6. A circuit pattern inspection apparatus as claimed in claim 5 wherein:

an electro-optical condition as to the electron beam which is again irradiated after the acquisition of said image for the inspection purpose corresponds to a transport direction of a substrate to be inspected, an acceleration voltage, a current, a scanning width, a scanning line pitch, and a repetition time.

* * * * *

UNITED STATES PATENT AND TRADEMARK OFFICE
CERTIFICATE OF CORRECTION

PATENT NO. : 7,223,975 B2  Page 1 of 1
APPLICATION NO. : 10/843642
DATED : May 29, 2007
INVENTOR(S) : Yasuhiko Nara et al.

It is certified that error appears in the above-identified patent and that said Letters Patent is hereby corrected as shown below:

On the title page of the Letters Patent,

Item "(73) Assignee:", change "Hitachi, Ltd., Tokyo (JP)" to
-- Hitachi High-Technologies Corporation, Tokyo (JP) --

Signed and Sealed this

Third Day of June, 2008

JON W. DUDAS
*Director of the United States Patent and Trademark Office*